United States Patent
Liu et al.

(10) Patent No.: US 12,402,516 B2
(45) Date of Patent: Aug. 26, 2025

(54) DISPLAY PANEL WITH CVD ENCAPSULATION LAYERS, DISPLAY APPARATUS COMPRISING THE ENCAPSULATION LAYERS, AND METHOD FOR MANUFACTURING THE DISPLAY PANEL

(71) Applicant: BOE TECHNOLOGY GROUP CO., LTD., Beijing (CN)

(72) Inventors: Wenqi Liu, Beijing (CN); Zhongyuan Sun, Beijing (CN); Qing Wang, Beijing (CN); Jinxiang Xue, Beijing (CN); Huajie Yan, Beijing (CN); Che An, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 588 days.

(21) Appl. No.: 17/782,471

(22) PCT Filed: Apr. 23, 2021

(86) PCT No.: PCT/CN2021/089381
§ 371 (c)(1),
(2) Date: Jun. 3, 2022

(87) PCT Pub. No.: WO2021/213510
PCT Pub. Date: Oct. 28, 2021

(65) Prior Publication Data
US 2023/0006178 A1    Jan. 5, 2023

(30) Foreign Application Priority Data
Apr. 23, 2020 (CN) .......................... 202010328116.3

(51) Int. Cl.
H10K 59/80    (2023.01)
H10K 50/844    (2023.01)
(Continued)

(52) U.S. Cl.
CPC ......... *H10K 59/873* (2023.02); *H10K 50/844* (2023.02); *H10K 59/1213* (2023.02); *H10K 59/38* (2023.02); *H10K 71/00* (2023.02)

(58) Field of Classification Search
CPC .. H10K 50/844; H10K 71/00; H10K 59/1213; H10K 59/38; H10K 59/873
(Continued)

(56) References Cited

U.S. PATENT DOCUMENTS

2012/0235171 A1    9/2012    Kim et al.
2014/0070186 A1    3/2014    Kim
(Continued)

FOREIGN PATENT DOCUMENTS

CN    102683381 A    9/2012
CN    103682156 A    3/2014
(Continued)

OTHER PUBLICATIONS

The First Office Action of Application No. CN202010328116.3 issued by the Chinese Patent Office on Mar. 24, 2022.

*Primary Examiner* — Eric W Jones
(74) *Attorney, Agent, or Firm* — XSENSUS LLP (57) ABSTRACT

A display panel includes a display substrate and an encapsulation layer. The display substrate includes: a base substrate; and a plurality of light-emitting devices disposed on the base substrate, the plurality of light-emitting devices being configured to emit light. The encapsulation layer is located on a side of the light-emitting devices away from the base substrate, and is configured to encapsulate the light-emitting devices. The encapsulation layer includes: a second encapsulation layer located on the side of the light-emitting devices away from the base substrate, and made of a silicon nitride material; and a third encapsulation layer located on a side of the second encapsulation layer away from the
(Continued)

light-emitting devices, and made of a silicon carbonitride material or a silicon carbide material.

11 Claims, 6 Drawing Sheets

(51) Int. Cl.
  *H10K 59/121* (2023.01)
  *H10K 59/38* (2023.01)
  *H10K 71/00* (2023.01)

(58) Field of Classification Search
  USPC .............................................. 257/40, 59, 99
  See application file for complete search history.

(56) References Cited

U.S. PATENT DOCUMENTS

| | | | |
|---|---|---|---|
| 2016/0372713 A1 | 12/2016 | Wang et al. | |
| 2018/0076399 A1* | 3/2018 | Kim | H10K 50/854 |
| 2018/0138376 A1* | 5/2018 | Koshihara | H10K 59/876 |
| 2018/0153006 A1* | 5/2018 | Ishida | H05B 33/10 |
| 2018/0315926 A1* | 11/2018 | Donoghue | H10K 71/191 |
| 2018/0374904 A1 | 12/2018 | Xu | |
| 2021/0091326 A1* | 3/2021 | Song | H10K 59/38 |
| 2021/0183647 A1* | 6/2021 | Hanft | H01L 21/76829 |
| 2021/0399056 A1* | 12/2021 | Wang | H10K 50/131 |
| 2022/0013588 A1* | 1/2022 | Motoyama | H10K 59/12 |
| 2023/0165115 A1* | 5/2023 | Guo | H10K 71/164 257/40 |

FOREIGN PATENT DOCUMENTS

| | | |
|---|---|---|
| CN | 106299153 A | 1/2017 |
| CN | 108364994 A | 8/2018 |
| CN | 109285958 A | 1/2019 |
| CN | 111490180 A | 8/2020 |

* cited by examiner

DISPLAY PANEL WITH CVD ENCAPSULATION LAYERS, DISPLAY APPARATUS COMPRISING THE ENCAPSULATION LAYERS, AND METHOD FOR MANUFACTURING THE DISPLAY PANEL

CROSS-REFERENCE TO RELATED APPLICATIONS

This application is a national phase entry under 35 USC 371 of International Patent Application No. PCT/CN2021/089381, filed on Apr. 23, 2021, which claims priority to Chinese Patent Application No. 202010328116.3, filed on Apr. 23, 2020, which are incorporated herein by reference in their entirety.

TECHNICAL FIELD

The present disclosure relates to the field of display technologies, and in particular, to a display panel, a display apparatus and a method for manufacturing the display panel.

BACKGROUND

OLED (organic light-emitting diode) display apparatuses have become a mainstream development trend of display apparatuses at present due to their advantages such as thinness and lightness, fast response, wide viewing angle, flexible folding and high contrast. OLED display apparatuses are very sensitive to water vapor and oxygen. In a case where the water vapor and oxygen enter the OLED display apparatus, organic materials of the OLED display apparatus are prone to decay, and thus a service life of the OLED display apparatus is shorten. Therefore, in order to prevent the entering of the water vapor and oxygen, it is necessary to encapsulate the OLED display apparatus, so as to prevent the entering of the water vapor and oxygen, thereby avoiding aging of the organic materials. As a result, the service life of the display apparatus is prolonged.

SUMMARY

In an aspect, a display panel is provided. The display panel includes a display substrate and an encapsulation layer. The display substrate includes: a base substrate; and a plurality of light-emitting devices disposed on the base substrate, the plurality of light-emitting devices being configured to emit light. The encapsulation layer is located on a side of the light-emitting devices away from the base substrate, and is configured to encapsulate the light-emitting devices. The encapsulation layer includes: a second encapsulation layer located on the side of the light-emitting devices away from the base substrate, and made of a silicon nitride material; and a third encapsulation layer located on a side of the second encapsulation layer away from the light-emitting devices, and made of a silicon carbonitride material or a silicon carbide material.

In some embodiments, the encapsulation layer further includes a first encapsulation layer located between the second encapsulation layer and the light-emitting devices, and made of a silicon oxynitride material.

In some embodiments, the first encapsulation layer is a first encapsulation layer manufactured by a chemical vapor deposition process; the second encapsulation layer is a second encapsulation layer manufactured by another chemical vapor deposition process; and the third encapsulation layer is a third encapsulation layer manufactured by yet another chemical vapor deposition process.

In some embodiments, the encapsulation layer further includes a fourth encapsulation layer located on a side of the third encapsulation layer away from the second encapsulation layer, and made of a silicon carbonitride material or a silicon carbide material.

In some embodiments, the first encapsulation layer is a first encapsulation layer manufactured by a chemical vapor deposition process; the second encapsulation layer is a second encapsulation layer manufactured by another chemical vapor deposition process; the third encapsulation layer is a third encapsulation layer manufactured by yet another chemical vapor deposition process; and the fourth encapsulation layer is a fourth encapsulation layer manufactured by yet another chemical vapor deposition process.

In some embodiments, the display panel further includes a color filter layer located on a side of the third encapsulation layer away from the base substrate. The third encapsulation layer is made of the silicon carbide material.

In some embodiments, the display panel further includes a fourth encapsulation layer located on a side of the color filter layer away from the third encapsulation layer. The fourth encapsulation layer is made of a silicon carbonitride material.

In some embodiments, the base substrate is a silicon-based backplane integrated with a plurality of pixel circuits. Each of the light-emitting devices includes a first electrode, a light-emitting functional layer and a second electrode. The plurality of pixel circuits are electrically connected to respective first electrodes of the light-emitting devices.

In some embodiments, the display panel further includes a color filter layer located on a side of the third encapsulation layer away from the base substrate, the third encapsulation layer being made of the silicon carbide material. The encapsulation layer further includes: a first encapsulation layer located between the second encapsulation layer and the light-emitting devices, and made of a silicon oxynitride material; and a fourth encapsulation layer located on a side of the color filter layer away from the third encapsulation layer, and made of a silicon carbonitride material. The base substrate is a silicon-based backplane integrated with a plurality of pixel circuits. Each of the light-emitting devices includes a first electrode, a light-emitting functional layer and a second electrode. The plurality of pixel circuits are electrically connected to respective first electrodes of the light-emitting devices.

In some embodiments, a thickness of the first encapsulation layer is in a range of 1000 Å to 10000 Å, inclusive; a thickness of the second encapsulation layer is in a range of 1000 Å to 10000 Å, inclusive; a thickness of the third encapsulation layer is in a range of 2000 Å to 20000 Å, inclusive; and a thickness of the fourth encapsulation layer is in a range of 1000 Å to 10000 Å, inclusive.

In another aspect, a display panel is provided. The display panel includes a display substrate and an encapsulation layer. The display substrate includes: a base substrate; and a plurality of light-emitting devices disposed on the base substrate, the plurality of light-emitting devices being configured to emit light. The encapsulation layer includes a first inorganic layer, a second inorganic layer, and a first organic layer that are stacked on the display substrate in sequence. The first inorganic layer is made of a silicon nitride material; the second inorganic layer is made of a silicon oxide material; and the first organic layer is made of a parylene material.

In some embodiments, the first inorganic layer is a first inorganic layer manufactured by a chemical vapor deposition process; the second inorganic layer is a second inorganic layer manufactured by an atomic layer deposition process; and the first organic layer is a first organic layer manufactured by a molecular layer deposition process.

In some embodiments, the display panel further includes a color filter layer located on a side of the first organic layer away from the second inorganic layer. The encapsulation layer further includes: a second organic layer located on a side of the color filter layer away from the first organic layer, and made of a parylene material; and a third inorganic layer located on a side of the second organic layer away from the first organic layer, and made of a silicon oxide material.

In some embodiments, the second organic layer is a second organic layer manufactured by a molecular layer deposition process; and the third inorganic layer is a third inorganic layer manufactured by an atomic layer deposition process.

In some embodiments, the base substrate is a silicon-based backplane integrated with a plurality of pixel circuits. Each of the light-emitting devices includes a first electrode, a light-emitting functional layer and a second electrode. The plurality of pixel circuits are electrically connected to respective first electrodes of the light-emitting devices.

In yet another aspect, a display apparatus is provided. The display apparatus includes the display panel of any one of the above, and a glass cover plate configured to protect the display panel.

In yet another aspect, a method for manufacturing a display panel is provided. The method includes: forming a display substrate; forming, on the display substrate, a second encapsulation layer by a chemical vapor deposition process; and forming, on the second encapsulation layer, a third encapsulation layer by another chemical vapor deposition process.

In some embodiments, the first encapsulation layer is made of a silicon oxynitride material; the second encapsulation layer is made of a silicon nitride material; the third encapsulation layer is made of a silicon carbide material; and the fourth encapsulation layer is made of a silicon carbonitride material.

In some embodiments, before forming, on the display substrate, the second encapsulation layer by the chemical vapor deposition process, the method further includes: forming, on the display substrate, a first encapsulation layer by yet another chemical vapor deposition process; or after forming, on the second encapsulation layer, the third encapsulation layer by the another chemical vapor deposition process, the method further includes: forming a color filter layer on the third encapsulation layer; and forming, on the color filter layer, a fourth encapsulation layer by yet another chemical vapor deposition process; or before forming, on the display substrate, the second encapsulation layer by the chemical vapor deposition process, the method further comprises: forming, on the display substrate, a first encapsulation layer by yet another chemical vapor deposition process; and after forming, on the second encapsulation layer, the third encapsulation layer by the another chemical vapor deposition process, the method further includes: forming a color filter layer on the third encapsulation layer; and forming, on the color filter layer, a fourth encapsulation layer by yet another chemical vapor deposition process.

In some embodiments, forming the display substrate includes: forming a silicon-based backplane integrated with a plurality of pixel circuits.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" and "some examples" are intended to indicate that specific features, structures or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Hereinafter, the terms "first" and "second" are only used for descriptive purposes, and are not to be construed as indicating or implying the relative importance or implicitly indicating the number of indicated technical features. Thus, a feature defined with the term "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, terms such as "coupled" and "connected" and derivatives thereof may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C. The phrase "A and/or B" includes the following three combinations: only A, only B, and a combination of A and B.

As used herein, depending on the context, the term "if" is optionally construed as "when", "in a case where", "in response to determining" or "in response to detecting". Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The phase "applicable to" or "configured to" used herein has an open and inclusive meaning, which does not exclude apparatuses that are applicable to or configured to perform additional tasks or steps.

In addition, the phase "based on" is meant to be open and inclusive, since a process, step, calculation or other action that is "based on" one or more of the stated conditions or values may, in practice, be based on additional conditions or values other than those stated.

As used herein, terms such as "about", "substantially" or "approximately" include a stated value and an average value within an acceptable range of deviation of a particular value. The acceptable range of deviation is determined by a person of ordinary skill in the art in view of the measurement in question and errors associated with the measurement of a particular quantity (i.e., limitations of the measurement system).

Exemplary embodiments are described herein with reference to sectional views and/or plan views as idealized exemplary drawings. In the accompanying drawings, thicknesses of layers and sizes of regions are enlarged for clarity. Thus, variations in shapes relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

Figure 1:
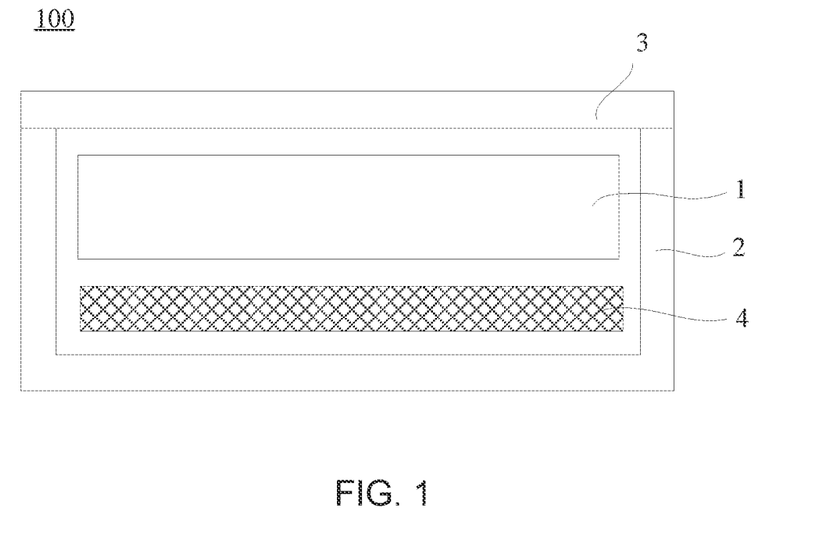
FIG. 1 is a structural diagram of a display apparatus, in accordance with some embodiments.

In some embodiments of the present disclosure, as shown in FIG. 1, a display apparatus 100 is provided. The display apparatus 100 may include a display panel 1, a frame 2, a glass cover plate 3, a circuit board 4 and other electronic accessories.

As shown in FIG. 1, a longitudinal section of the frame 2 is U-shaped, the display panel 1, the circuit board 4 and the other electronic accessories are all disposed in the frame 2, the circuit board 4 is disposed behind the display panel 1, and the glass cover plate 3 is disposed on a side of the display panel 1 away from the circuit board 4.

The display apparatus 100 may be an organic light-emitting diode (OLED) display apparatus. In this case, the display panel 1 is an organic electroluminescent display panel. The display apparatus 100 may also be a quantum dot light-emitting diode (QLED) display apparatus. In this case, the display panel 1 is a quantum dot electroluminescent display panel. For convenience of description, the following embodiments are all described by taking an example in which the display apparatus 100 is the OLED display apparatus.

Figure 2A:
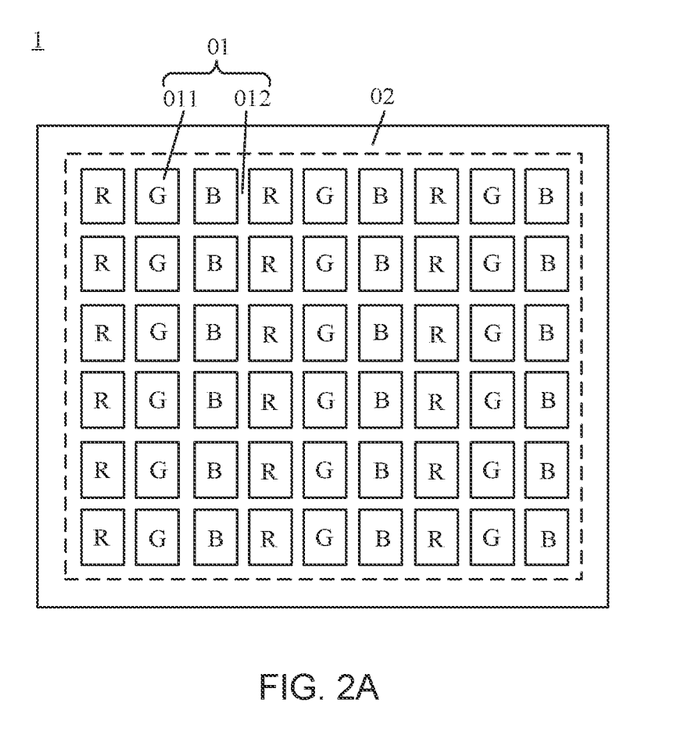
FIG. 2A is a diagram of divided regions of a display panel, in accordance with some embodiments.
Figure 2B:
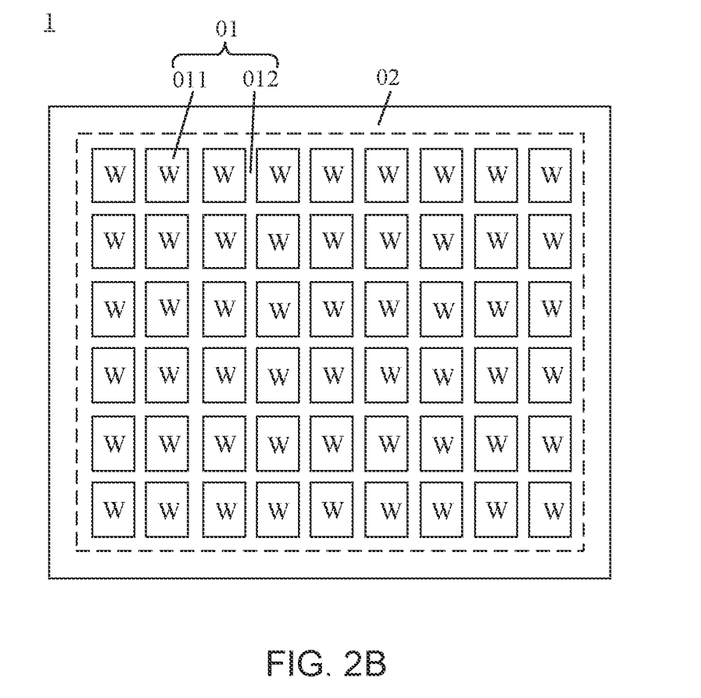
FIG. 2B is another diagram of divided regions of a display panel, in accordance with some embodiments.

As shown in FIG. 2A, it can be found that the display panel 1 has a display area 01 and a peripheral area 02 located on at least one side of the display area 01 when viewed from a viewing angle directly facing a display surface of the display panel 1. FIGS. 2A and 2B illustrate an example in which the peripheral area 02 surrounds the display area 01, which is not limited in the embodiments of the present disclosure.

With reference to FIG. 2A, the display area 01 may include a plurality of light-emitting regions 011 (each light-emitting region 011 corresponding to a sub-pixel) and a non-light-emitting region 012. In some embodiments, the plurality of light-emitting regions 011 may include red light-emitting regions for emitting red light, blue light-emitting regions for emitting blue light, and green light-emitting regions for emitting green light. In some embodiments, as shown in FIG. 2A, a column of red light-emitting regions R, a column of green light-emitting regions G and a column of blue light-emitting regions B are alternately arranged in turn. In some other embodiments, an arrangement order of the red light-emitting regions R, the green light-emitting regions G, and the blue light-emitting regions B may be changed.

In some other embodiments, the plurality of light-emitting regions 011 may all be used for emitting white light. For example, as shown in FIG. 2B, each light-emitting region 011 is a white light-emitting region W for emitting white light.

In addition, the peripheral area 02 in FIG. 2A or 2B is used for wiring, so that a plurality of sub-pixels in the display area 01 are connected to gate drive circuit(s) or source drive circuit(s) through the wiring. Moreover, the gate drive circuit(s) may also be arranged in the peripheral area 02 by using the gate driver on array (GOA) technology, and thus a size of the peripheral area 02 is reduced. As a result, a narrow bezel of the display apparatus is realized.

In order to further describe the display panel 1 in some embodiments of the present disclosure, an internal structure of the display panel 1 is described in detail below. It will be noted that, since a structure corresponding to each light-emitting region 011 of the display panel 1 is basically repeated, FIGS. 3 and 4 will be illustrated below by taking an example in which only a portion of the structure corresponding to the light-emitting region 011 of the display panel 1 in FIG. 2A or 2B is showed.

Figure 3:
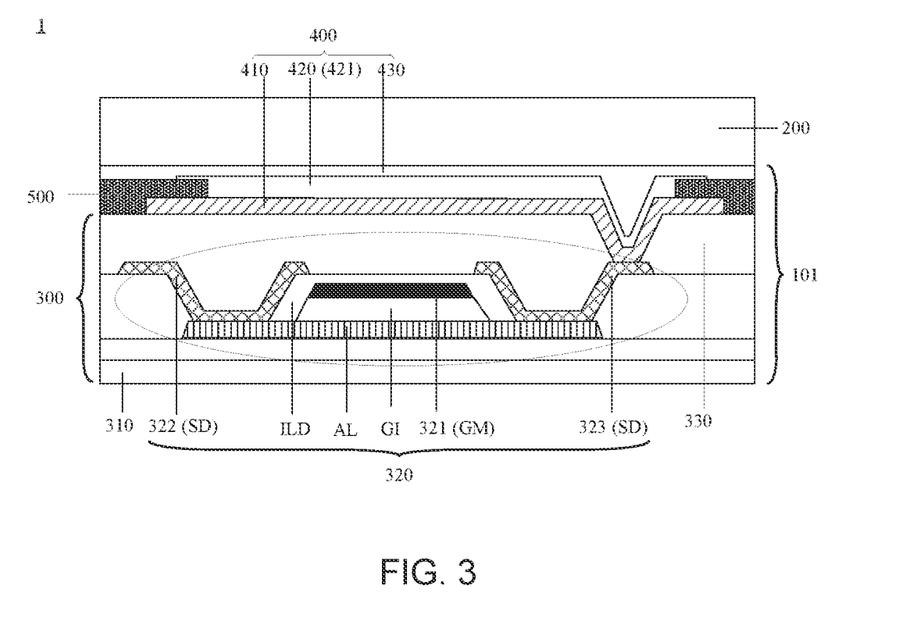
FIG. 3 is a structural diagram of a display panel, in accordance with some embodiments.

In some embodiments of the present disclosure, as shown in FIG. 3, the display panel 1 may include a display substrate 101 and an encapsulation layer 200 for encapsulating the display substrate 101. The encapsulation layer 200 may be used to prevent water vapor and oxygen from entering the display substrate 101.

Firstly, a structure of the display substrate 101 will be exemplarily described below. As shown in FIG. 3, the display substrate 101 may include a base substrate 300 and light-emitting devices 400 disposed on the base substrate 300.

It is easily understood that the base substrate 300 may be a blank substrate, or a substrate with film structure(s).

In some embodiments, the base substrate 300 includes a blank substrate 310, and pixel circuits disposed on the blank substrate 310.

In some embodiments, the blank substrate 310 may be a flexible blank substrate or a rigid blank substrate. A material of the flexible blank substrate 310 may be, for example, polyimide (PI). A material of the rigid blank substrate 310 may be, for example, glass.

In some other embodiments, the base substrate 300 may be a silicon-based backplane. It will be noted that an accuracy of pixel circuits included in the silicon-based backplane is much higher than an accuracy of pixel circuits manufactured on a glass substrate or a polyimide substrate. For example, a size of the pixel circuits included in the silicon-based backplane may reach a level required by a chip for a size of a circuit device. However, an accuracy that can be achieved by current manufacturing processes of the light-emitting devices 400 is difficult to match the accuracy of the pixel circuits included in the silicon-based backplane. As a result, in the case where the base substrate 300 is the silicon-based backplane, the plurality of light-emitting regions 011 are generally white light-emitting regions for emitting white light (as shown in FIG. 2B).

The base substrate 300 further includes gate lines arranged in a direction on the blank substrate 310, and data lines and common power lines that are insulated from and cross the gate lines on the blank substrate 310. The common power lines are generally parallel to the data lines. The plurality of sub-pixels may be defined by the gate lines and the data lines (or both the data lines and the common power lines) that are arranged crosswise. Each sub-pixel has a pixel circuit, and the pixel circuit is electrically connected to a light-emitting device 400 for driving the light-emitting device 400 to emit light.

Figure 4:
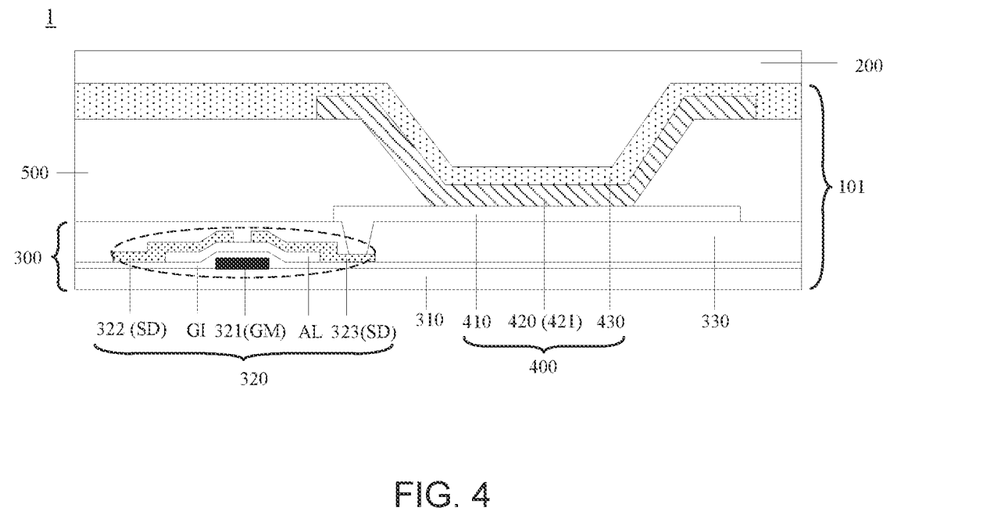
FIG. 4 is a structural diagram of another display panel, in accordance with some embodiments.

The pixel circuit may include at least one thin film transistor (abbreviated as: TFT) 320 and at least one capacitor (not shown in FIG. 3). Each thin film transistor 320 may be of a top-gate structure or a bottom-gate structure. As shown in FIG. 3, in the case where the thin film transistor 320 has the top-gate structure, the thin film transistor 320 includes an active layer AL, a gate insulating layer GI, a gate metal layer GM (i.e., a gate electrode 321), an interlayer dielectric layer ILD, and a source-drain metal layer SD (including a source electrode 322 and a drain electrode 323) that are disposed on the blank substrate 310 in sequence. In some other embodiments, as shown in FIG. 4, in the case where the thin film transistor 320 has the bottom-gate structure, the thin film transistor 320 includes a gate metal layer GM (i.e., a gate electrode 321), a gate insulating layer GI, an active layer AL, and a source-drain metal layer SD (including a source electrode 322 and a drain electrode 323) that are disposed on the blank substrate 310 in sequence.

The active layer AL of the thin film transistor 320 may be made of amorphous silicon, monocrystalline silicon, polycrystalline silicon, or an oxide semiconductor. The active layer AL includes a channel region that is not doped with any impurity, and a source region and a drain region that are located on two sides of the channel region and formed by being doped with an impurity. The doped impurity changes as the type of the thin film transistor 320 changes, and may be an N-type impurity or a P-type impurity.

The capacitor includes a first electrode plate and a second electrode plate. An interlayer insulating film is provided between the first electrode plate and the second electrode plate as a dielectric.

Electrical connection relationships of an inside and an outside of the pixel circuit will be described below by taking an example in which the pixel circuit includes two thin film transistors (i.e., a switching thin film transistor and a driving thin film transistor) and one capacitor, which constitutes a 2T1C structure. Although FIG. 3 only shows structures of the driving thin film transistor 320 (e.g., the structure in the dashed circle in FIG. 3) and the light-emitting device 400 and a connection relationship therebetween, according to the description of the context, those skilled in the art may fully determine the structure of the switching transistor and connection relationships between the switching transistor and other components.

Figure 5:
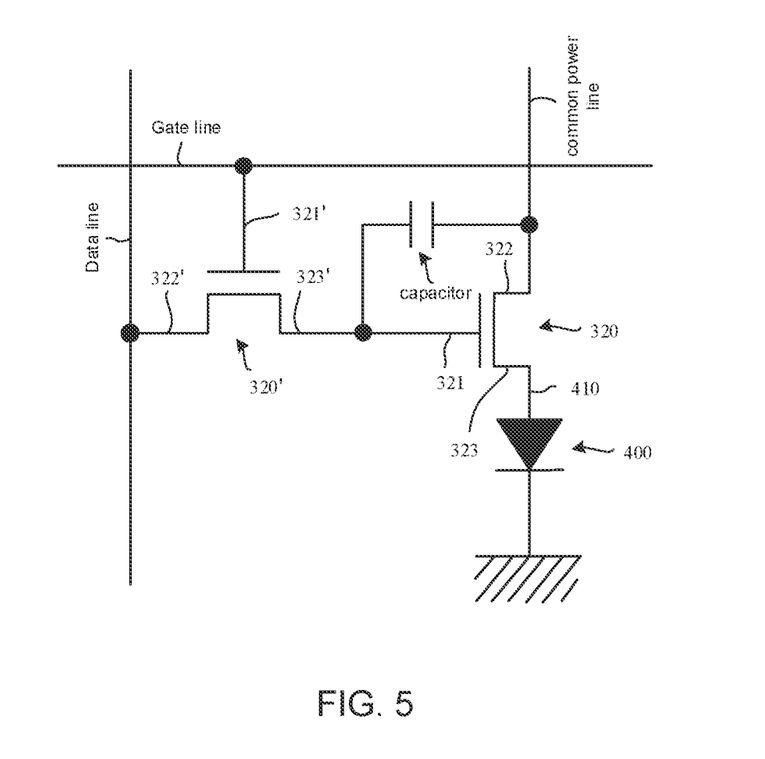
FIG. 5 is an equivalent circuit diagram of a pixel circuit, in accordance with some embodiments.

As shown in FIG. 5, a gate 321' of the switching thin film transistor 320' is connected to a gate line, a source 322' of the switching thin film transistor 320' is connected to a data line, and a drain 323' of the switching thin film transistor 320' is connected to a gate 321 of the driving thin film transistor 320. A source 322 of the driving thin film transistor 320 is connected to a common power line, and a drain 323 of the driving thin film transistor 320 is connected to a first electrode 410 of the light-emitting device 400 through a via hole. The first electrode plate of the capacitor is connected to the gate 321 of the driving thin film transistor 320, and the second electrode plate of the capacitor is connected to the source 322 of the driving thin film transistor 320.

The switching thin film transistor 320' is turned on by a gate voltage applied to the gate line, so that a data voltage applied to the data line is transmitted to the driving thin film transistor 320. There is a certain difference between the data voltage transmitted from the switching thin film transistor 320' to the driving thin film transistor 320 and the common voltage applied to the driving thin film transistor 320 from the common power line. A voltage equivalent to an absolute value of the difference is stored in the capacitor, and a current corresponding to the voltage stored in the capacitor flows into the light-emitting device 400 through the driving thin film transistor 320, so that the light-emitting device 400 emits light.

In addition, as shown in FIGS. 3 and 4, the light-emitting device 400 includes a first electrode 410, a light-emitting functional layer 420, and a second electrode 430 that are disposed on the base substrate 300 in sequence. One of the first electrode 410 and the second electrode 430 is an anode (for providing holes), and the other one of the first electrode 410 and the second electrode 430 is a cathode (for providing electrons). The first electrode 410 and the second electrode 430 respectively inject the holes and the electrons into the light-emitting functional layer 420, and the light-emitting functional layer 122 emits light when excitons generated by the combination of the holes and the electrons transitions from an excited state to a ground state.

The first electrode 410 may be made of a metal with high reflectivity, and the second electrode 430 may be made of a transparent conductive material. In this case, light from the light-emitting functional layer 420 is reflected by the first electrode 410 and exit through the second electrode 430. Thus, the light-emitting device 400 is a top-emission light-emitting device. However, it is not limited thereto. In a case where the first electrode 410 is made of a transparent conductive material and the second electrode 430 is material of a metal with high reflectivity, a bottom-emission light-emitting device may be formed. Of course, in a case where the first electrode 410 and the second electrode 430 each are made of a transparent conductive material, a double-sided-emission light-emitting device may be formed.

The transparent conductive material may be, for example, indium tin oxide (ITO), indium zinc oxide (IZO) or indium gallium zinc oxide (IGZO). The metal with high reflectivity may be, for example, Ag.

In some embodiments, as shown in FIGS. 3 and 4, the light-emitting functional layer 420 may include a light-emitting layer 421. In some other embodiments, in addition to the light-emitting layer 421, the light-emitting functional layer 420 may further include at least one of a hole injection layer (HIL), a hole transport layer (HTL), an electron transport layer (ETL) and an electron injection layer (EIL) (not shown in FIGS. 3 and 4). In a case where the light-emitting functional layer 420 includes all the above layers, the hole injection layer, the hole transport layer, the light-emitting layer 421, the electron transport layer, and the electron injection layer are sequentially stacked on the first electrode 410 as the anode.

In some embodiments, as shown in FIGS. 3 and 4, the base substrate 300 may further include a planarization layer 330 disposed between thin film transistors 320 and first electrodes 410, and a pixel define layer 500 disposed on a side of the first electrodes 410 away from the blank substrate 310. The pixel define layer 500 has a plurality of openings and a barrier wall disposed around each opening. The light-emitting device 400 is disposed in an opening region. First electrodes 410 and light-emitting layers 421 of adjacent light-emitting devices 400 are separated by the barrier wall of the pixel define layer 500.

In the case where the light-emitting device 400 includes the at least one of the hole injection layer, the hole transport layer, the electron transport layer and the electron injection layer, the at least one of the hole injection layer, the hole transport layer, the electron transport layer and the electron injection layer of the light-emitting device 400 may be disconnected from that of adjacent light-emitting devices 400. That is, the at least one of the hole injection layer, the hole transport layer, the electron transport layer and the electron injection layer is only arranged in the opening. Alternatively, the at least one of the hole injection layer, the hole transport layer, the electron transport layer and the electron injection layer of the light-emitting device 400 may be formed a whole layer together with that of other light-emitting devices 400.

Since the light-emitting functional layer 420 is very sensitive to the water vapor and oxygen in the air, once the light-emitting functional layer 420 contacts the water vapor and oxygen in the air, organic materials of the light-emitting functional layer 420 may chemically react with the water vapor and oxygen. As a result, a performance of the OLED display apparatus is degraded and a service life of the OLED display apparatus is shortened.

In order to ameliorate the above technical problems, it can be seen from the above, as shown in FIGS. 3 and 4, the display panel 1 may further include an encapsulation layer 200 for encapsulating the display substrate 101. The encapsulation layer 200 may be used to prevent the water vapor and oxygen from entering the display substrate 101.

Some embodiments of the present disclosure provide different structures of the encapsulation layer 200 for the display substrate 101. The different structures of the encapsulation layers 200 will be described in detail below. It will be noted that, in order to simplify the accompany drawings, the following accompany drawings do not show the structure of the display substrate 101.

As described above, the base substrate 300 in the display substrate 101 may be the glass substrate, the polyimide substrate, or the silicon-based backplane integrated with the pixel circuits. The accuracy of the pixel circuits included in the silicon-based backplane is much higher than the accuracy of the pixel circuits manufactured on the glass substrate or the polyimide substrate. With a rapid growth of market demand, especially in recent years, with a significant growth of the market demand for virtual reality (VR) and augmented reality (AR) technologies, display panels 1 are moving towards miniaturization and high pixel density at an accelerated pace. The display panels 1 adopting the silicon-based backplanes are becoming a focus of attention in the display field by virtue of their advantages of miniaturization and high pixel density.

In the case where the silicon-based backplane is used as the base substrate 300, since the accuracy that can be achieved by the manufacturing processes of the light-emitting devices 400 is difficult to match the accuracy of the pixel circuits included in the silicon-based backplane, the plurality of light-emitting regions 011 are generally the white light-emitting regions for emitting white light (as shown in FIG. 2B). In this case, a color filter layer needs to be provided on the display substrate 101. The color filter layer includes three types of photoresists (i.e., RGB photoresists) corresponding to three types of sub-pixels (i.e., RGB sub-pixels), so as to filter the white light emitted by the light-emitting devices 400 to convert the white light into light of three primary colors (i.e., light of RGB colors).

It will be understood that, in the case where the silicon-based backplane is used as the base substrate 300, the plurality of light-emitting regions 011 may still include the red light-emitting regions R, the green light-emitting regions G, and the blue light-emitting regions B (as shown in FIG. 2A). For example, in a case where the accuracy that can be achieved by manufacturing processes of the light-emitting devices 400 may match the accuracy of the pixel circuits included in the silicon-based backplane, or users have less requirements for the pixel density of the display panel 1, a plurality of light-emitting devices 400 corresponding to the plurality of light-emitting regions 011 may include light-emitting devices 400 for emitting red light, light-emitting devices 400 for emitting green light, and light-emitting devices 400 for emitting blue light.

For convenience of description, unless otherwise specified, the following embodiments will be described by taking an example in which the plurality of light-emitting devices 400 are configured to emit white light.

Figure 6:
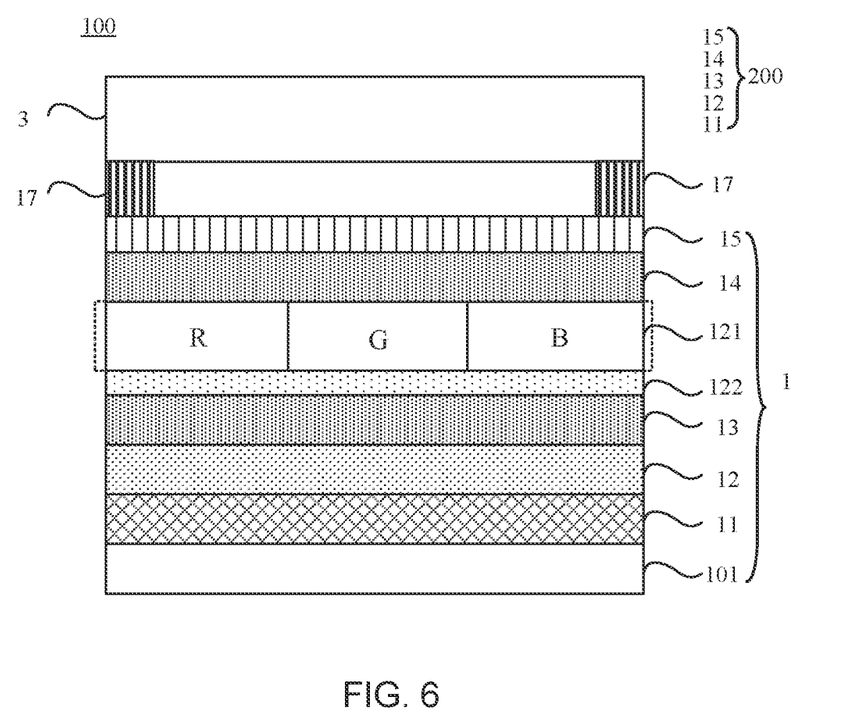
FIG. 6 is a structural diagram showing a display panel and a glass cover plate, in accordance with some embodiments.

As shown in FIG. 6, the encapsulation layer 200 includes a first inorganic layer 11, a second inorganic layer 12, a first organic layer 13, a second organic layer 14 and a third inorganic layer 15 that are disposed on the display substrate 101 in sequence. Moreover, as shown in FIG. 6, the display panel 1 further includes a color filter layer 121 located between the first organic layer 13 and the second organic layer 14. The glass cover plate 3 for covering the display panel 1 is located on a side of the third inorganic layer 15 away from the display substrate 101, and the glass cover plate 3 is bonded to the display panel 1 through a frame sealant 17.

The color filter layer 121 is generally manufactured by a photolithography process. It will be noted that, the photolithography process typically refers to a process of forming a specific pattern by using a mask and removing photoresist. Forming the specific pattern includes coating a surface of a film with photoresist; exposing the photoresist; developing after exposing the photoresist; and etching regions of the film exposed by the photoresist, so as to form a required pattern.

The first inorganic layer 11 is made of a silicon nitride (SiNx) material, and may be manufactured by a chemical vapor deposition (CVD) equipment. Since the first inorganic layer 11 made of the silicon nitride material has good denseness and intactness, it may be possible to prevent the entering of the water vapor and oxygen. Therefore, by providing the first inorganic layer 11 in the encapsulation layer 200, it may be possible to prevent the water vapor and oxygen from entering the display substrate 101, so as to avoid the aging of the light-emitting functional layer 420. As a result, the service life of the display apparatus 100 is prolonged.

The second inorganic layer 12 is made of a silicon oxide material, and may be manufactured by an atomic layer deposition (ALD) equipment. The second inorganic layer 12 may play a role of blocking the water vapor and oxygen for the display substrate 101 located below the second inorganic layer 12.

The first organic layer 13 is made of a parylene material, and may be manufactured by a molecular layer deposition (MLD) equipment. The first organic layer 13 may play a role of planarizing the display substrate 101 located below the first organic layer 13 and wrapping particles of the display substrate 101.

The color filter layer 121 includes three types of photoresists (i.e., RGB photoresists). In a manufacturing process of the color filter layer 121, a process procedure and process parameters of the manufacturing process of the color filter layer 121 are particularly important, and fineness of the manufacturing process of the color filter layer 121 determines a resolution of a silicon-based display panel. Low temperature color filter technology is a color filter technology applied to the silicon-based display panel, which can achieve pixel processing accuracy of 1-2 microns. A problem of the low temperature color filter technology is that a low temperature curing process for curing the three photoresist materials (i.e., RGB photoresist materials) results in poor adhesion between the color filter layer 121 and the first organic layer 13. In order to ameliorate the technical problem, as shown in FIG. 6, the display panel 1 further includes an adhesive layer 122 disposed between the color filter layer 121 and the first organic layer 13. By providing the adhesive layer 122 in the display panel 1, it is possible to improve an adhesive force between the color filter layer 121 and the first organic layer 13, which improves a reliability of the display apparatus 100.

The second organic layer 14 is made of a parylene material and is manufactured by the MLD equipment. The second organic layer 14 may play a role of planarizing the color filter layer 121 located below the second organic layer 14 and wrapping particles of the color filter layer 121.

The third inorganic layer 15 is made of a silicon oxide (SiO₂) material and is manufactured by the ALD equipment. By providing the third inorganic layer 15 in the display panel 1, and utilizing an inorganic property of the third inorganic layer 15, the display panel 1 may be better bonded to the glass cover plate 3, which prolongs the service life of the display apparatus 100.

Thus, by manufacturing the encapsulation layer 200 on the display substrate 101, it is possible to effectively prevent the water vapor and oxygen from entering the display substrate 101, so as to avoid the aging of the light-emitting functional layer 420. As a result, the service life of the display apparatus 100 is prolonged. For example, the encapsulation layer 200 includes the first inorganic layer 11, the second inorganic layer 12, the first organic layer 13, the second organic layer 14 and the third inorganic layer 15 that are disposed on the display substrate 101 in sequence.

It will be noted that, in some embodiments, in a case where requirements for the service life and performance of the display apparatus 100 are not high, the first inorganic layer 11 in the encapsulation layer 200 may be omitted. In this way, the process may be simplified, and thus the cost may be reduced. In addition, a thickness of the display apparatus 100 may be reduced, and thus a thin and light design of the display apparatus 100 may be realized. In this case, the encapsulation layer 200 composed of the second inorganic layer 12, the first organic layer 13, the second organic layer 14 and the third inorganic layer 15 may also prevent the water vapor and oxygen from entering the display substrate 101.

In some embodiments, in the case where the plurality of light-emitting devices 400 includes the light-emitting devices 400 for emitting red light, the light-emitting devices 400 for emitting green light, and the light-emitting devices 400 for emitting blue light, there is no need to provide the color filter layer 121 in the display panel 1. In this case, the second organic layer 14 may also be omitted. In this way, the process is simplified, and thus the cost is reduced. In this case, the encapsulation layer 200 composed of the first inorganic layer 11, the second inorganic layer 12, the first organic layer 13 and the third inorganic layer 15 may prevent the water vapor and oxygen from entering the display substrate 101.

In some embodiments, the third inorganic layer 15 may also be omitted.

In some embodiments, at least two of the first inorganic layer 11, the color filter layer 121, the second organic layer 14 and the third inorganic layer 15 may be omitted. In this way, the process is further simplified, and thus the cost is further reduced. Moreover, the thickness of the display apparatus 100 is further reduced, thereby realizing a thin and light design of the display apparatus 100.

Figure 7:
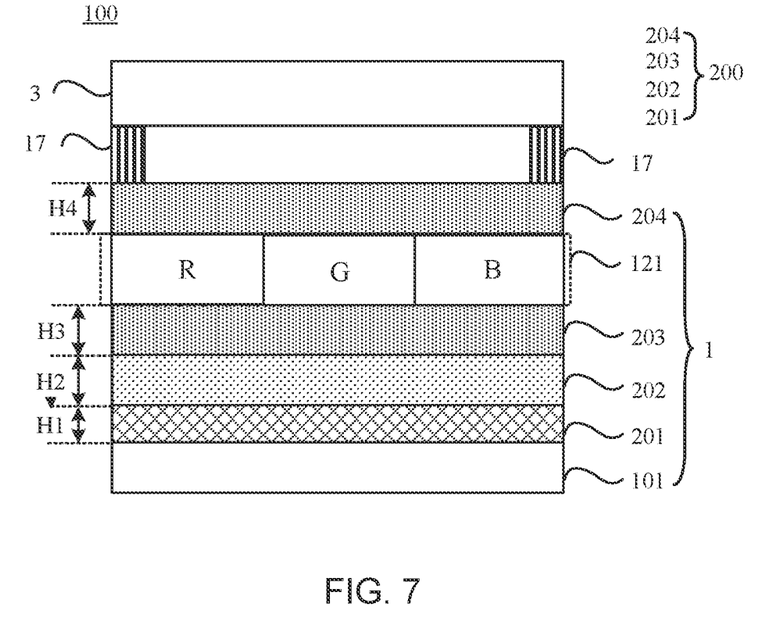
FIG. 7 is another structural diagram showing a display panel and a glass cover plate, in accordance with some embodiments.

In some embodiments, as shown in FIG. 7, another encapsulation layer 200 is provided. As shown in FIG. 7, the encapsulation layer 200 includes a first encapsulation layer 201, a second encapsulation layer 202, a third encapsulation layer 203 and a fourth encapsulation layer 204 that are disposed on the display substrate 101 in sequence. The first encapsulation layer 201, the second encapsulation layer 202, the third encapsulation layer 203 and the fourth encapsulation layer 204 each are manufactured by a chemical vapor deposition process. As shown in FIG. 7, the display panel 1 further includes a color filter layer 121 located between the third encapsulation layer 203 and the fourth encapsulation layer 204. The glass cover plate 3 for covering the display panel 1 is located on a side of the fourth encapsulation layer 204 away from the display substrate 101, and the glass cover plate 3 is bonded to the display panel 1 by a sealant 17.

The first encapsulation layer 201 may be made of a silicon oxynitride (SiON) material. The silicon oxynitride (SiON)

contains an oxygen element, so that a surface of the first encapsulation layer 201 may have a good interface quality, and have good water resistance. In addition, a refractive index of the silicon oxynitride is small (e.g., the refractive index of the silicon oxynitride is smaller than a refractive index of silicon nitride), which helps adjust an antireflection effect of laminated films of thin film encapsulation (TFE), so as to increase light extraction efficiency of the light-emitting devices 400.

The embodiments of the present disclosure do not limit a specific value of a thickness of the first encapsulation layer 201. As shown in FIG. 7, the thickness H1 of the first encapsulation layer 201 may be in a range of 1000 Å to 10000 Å, inclusive (i.e., 1000 Å≤H1≤10000 Å). For example, the thickness H1 of the first encapsulation layer 201 may be 1500 Å, 3500 Å, 5000 Å, 6500 Å, or 8500 Å. In this way, the first encapsulation layer 201 not only may block the water vapor and oxygen for the display substrate 101, but also does not affect the light extraction effect of the display panel 1. Moreover, the manufacturing cost is saved. In addition, since industrial production efficiency of manufacturing the silicon oxynitride layer by using the CVD equipment is high, a purpose of improving the production efficiency may be achieved by using the CVD equipment to manufacture the silicon oxynitride layer.

The second encapsulation layer 202 may be made of a silicon nitride (SiNx) material. Since the second encapsulation layer 202 made of the silicon nitride material is intact and dense, the second encapsulation layer 202 may block the water vapor and oxygen for the display substrate 101, and prevent the water vapor and oxygen from entering the electroluminescent devices and the base substrate 300.

The embodiments of the present disclosure do not limit a specific value of a thickness of the second encapsulation layer 202. As shown in FIG. 7, the thickness H2 of the second encapsulation layer 202 may be in a range of 1000 Å to 10000 Å, inclusive (i.e., 1000 Å≤H2≤10000 Å). For example, the thickness H2 of the second encapsulation layer 202 may be 3000 Å, 5000 Å, 8000 Å, or 9000 Å. In this way, the second encapsulation layer 202 not only may block the water vapor and oxygen for the display substrate 101, but also does not affect the light extraction effect of the display panel 1. Moreover, the manufacturing cost is saved. In addition, since industrial production efficiency of manufacturing the silicon nitride layer by using the CVD equipment is high, the purpose of improving the production efficiency may be achieved by using the CVD equipment to manufacture the silicon nitride layer.

The third encapsulation layer 203 may be made of a silicon carbonitride material. The silicon carbonitride (SiCN) layer mainly plays a role of covering particles on the second encapsulation layer 202 and planarizing the second encapsulation layer 202. The particles mainly come from an evaporation process and a transport process in manufacturing. The silicon carbonitride has the inorganic property, and thus has a good blocking property.

In some embodiments, the third encapsulation layer 203 may be made of a silicon carbide (SiC) material. Since the silicon carbide (SiC) has excellent flatness and is well bonded to the color filter layer 121, the silicon carbide layer may be used as both a planarization layer and an adhesive layer. Therefore, in the case where the third encapsulation layer 203 is made of the silicon carbide (SiC) material, compared with the structure in FIG. 6, the adhesive layer 122 may be omitted.

Moreover, since the industrial production efficiency of the silicon carbonitride layer or the silicon carbide layer manufactured by the CVD equipment is high, the purpose of improving the production efficiency may be achieved by using the CVD equipment to produce the silicon carbonitride layer or the silicon carbide layer.

The embodiments of the present disclosure do not limit a specific value of a thickness of the third encapsulation layer 203. As shown in FIG. 7, the thickness H3 of the third encapsulation layer 203 may be in a range of 2000 Å to 20000 Å, inclusive (i.e., 2000 Å≤H3≤20000 Å). For example, the thickness H3 of the third encapsulation layer 203 may be 3000 Å, 5000 Å, 8000 Å, 10000 Å, 15000 Å, or 18000 Å. In this way, the third encapsulation layer 203 not only may block the water vapor and oxygen for the display substrate 101, but also does not affect the light extraction effect of the display panel 1. Moreover, the manufacturing cost is saved.

The fourth encapsulation layer 204 may be made of the silicon carbonitride (SiCN) material. Compared with a parylene material, the silicon carbonitride material has the inorganic property. Thus, the fourth encapsulation layer 204 meets requirements for being bonded to the glass cover plate 3 located thereon. In this case, compared with the structure in FIG. 6, the third inorganic layer 15 may be omitted.

As shown in FIG. 7, a thickness H4 of the fourth encapsulation layer 204 may be in a range of 1000 Å to 10000 Å, inclusive (i.e., 1000 Å≤H4≤10000 Å).

In some embodiments, the fourth encapsulation layer 204 may also be made of the silicon carbide (SiC) material. The fourth encapsulation layer 204 plays a role of planarization, so as to cover particles generated in the manufacturing process, and prevent the entering of the water vapor and oxygen.

In the case where the third encapsulation layer 203 is made of the silicon carbonitride material, the fourth encapsulation layer 204 may be made of either the silicon carbonitride material or the silicon carbide material. Similarly, in the case where the third encapsulation layer 203 is made of the silicon carbide material, the fourth encapsulation layer 204 may be made of either the silicon carbonitride material or the silicon carbide material.

The fourth encapsulation layer 204 is also manufactured by the CVD equipment. Compared with the structure in FIG. 6, the fourth encapsulation layer 204 manufactured by the CVD equipment replaces the second organic layer 14 manufactured by the MLD equipment and the third inorganic layer 15 manufactured by the ALD equipment.

Thus, by manufacturing the encapsulation layer 200 on the display substrate 101, it is possible to effectively prevent the water vapor and oxygen from entering the display substrate 101, so as to avoid the aging of the light-emitting functional layer 420, thereby prolonging the service life of the display apparatus 100. For example, the encapsulation layer 200 includes the first encapsulation layer 201, the second encapsulation layer 202, the third encapsulation layer 203 and the fourth encapsulation layer 204 that are stacked on the display substrate 101. Since the layers that constitute the encapsulation layer 200 are manufactured by deposition using the CVD equipment with high efficiency, it may reduce a waste of the equipment, and improve the mass production efficiency. In addition, a shadow of the layer deposited by the CVD equipment is smaller, which is easier to control. Moreover, the number of the layers of the encapsulation layer 200 is reduced, which may simplify the manufacturing process, reduce the production cost, and realize the thin and light design of the display apparatus 100.

In some embodiments, in the case where the requirements for the service life and performance of the display apparatus 100 are not high, the first encapsulation layer 201 may be omitted. By utilizing only the second encapsulation layer 202, the third encapsulation layer 203 and the fourth encapsulation layer 204, it is possible to effectively prevent the water vapor and oxygen from entering the display substrate 101. In this way, the process is simplified, and thus the cost is reduced. In some embodiments, in the case where the plurality of light-emitting devices 400 includes the light-emitting devices 400 for emitting red light, the light-emitting devices 400 for emitting green light, and the light-emitting devices 400 for emitting blue light, there is no need to provide a color filter layer 121 in the display panel 1, and thus the fourth encapsulation layer 204 may also be omitted.

In some embodiments, at least two of the first encapsulation layer 201, the color filter layer 121 and the fourth encapsulation layer 204 may be omitted. In this way, the process is further simplified, and thus the cost is further reduced. Moreover, the thickness of the display apparatus 100 is further reduced, thereby realizing the thin and light design of the display apparatus.

Figure 8:
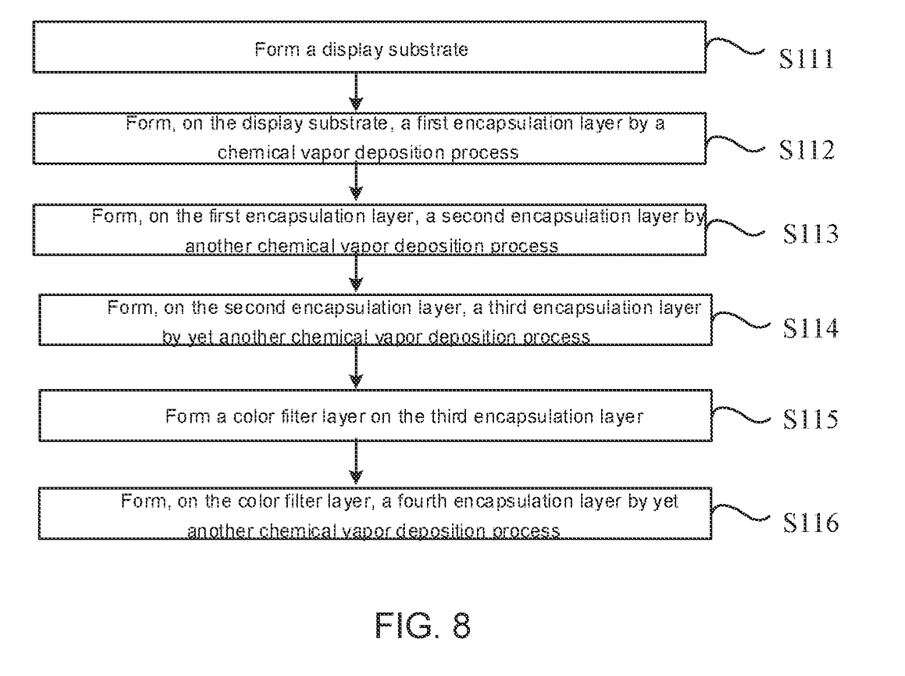
FIG. 8 is a flowchart of a method for manufacturing a display panel, in accordance with some embodiments.

As shown in FIG. 8, some embodiments of the present disclosure provide a method for manufacturing a display panel. For convenience of description, descriptions will be made below by taking an example of the structure of the display panel 1 shown in FIG. 7. The method includes the following steps (S111 to S116).

In S111, a display substrate 101 is formed.

The step of forming the display substrate 101 includes: forming a base substrate 300, first electrodes 410, light-emitting functional layers 420 and second electrodes 430 in sequence. Thin film transistors 320 for driving light-emitting devices 400 are integrated in the base substrate 300. Film layers that constitute the thin film transistors 320 may be formed by photolithography processes. The thin film transistors in the base substrate 300 may be silicon-based thin film transistors.

In S112, a first encapsulation layer 201 is formed on the display substrate 101 through chemical vapor deposition.

The first encapsulation layer 201 is formed on the display substrate 101 through a chemical vapor deposition process. The first encapsulation layer 201 is made of a silicon oxynitride (SiON) material. As a first layer of the encapsulation layer 200, the silicon oxynitride (SiON) layer has good water resistance and low refractive index, which helps electroluminescent devices to emit light. A thickness H1 of the silicon oxynitride layer may be 3500 Å.

In S113, a second encapsulation layer 202 is formed on the first encapsulation layer 201 through chemical vapor deposition.

The second encapsulation layer 202 is formed on the first encapsulation layer 201 through a chemical vapor deposition process. The second encapsulation layer 202 is made of a silicon nitride material. As a second layer of the encapsulation layer 200, the silicon nitride (SiNx) layer may play a role of blocking water vapor and oxygen, so as to prevent the water vapor and oxygen from entering the display substrate 101. A thickness H2 of the silicon nitride layer may be 5000 Å.

In S114, a third encapsulation layer 203 is formed on the second encapsulation layer 202 through chemical vapor deposition.

The third encapsulation layer 203 is formed on the second encapsulation layer 202 through a chemical vapor deposition process. In some embodiments, the third encapsulation layer 203 may be made of a silicon carbide material. Since the silicon carbide (SiC) has excellent flatness and is well bonded to a color filter layer 121, the silicon carbide layer may be used as both a planarization layer and an adhesive layer. In addition, since a bonding force between the silicon nitride and the color filter layer 121 is smaller than a bonding force between parylene and the color filter layer 121, when the color filter layer 121 is developed, there will be no residue on the third encapsulation layer 203, which improves a display quality.

In S115, the color filter layer 121 is formed on the third encapsulation layer 203.

For the color filter layer 121 including filter units of three primary colors, the filter units of three primary colors may be formed through three photolithography processes.

In S116, a fourth encapsulation layer is formed on the color filter layer 121 through chemical vapor deposition.

The fourth encapsulation layer is formed on the color filter layer 121 through a chemical vapor deposition process. The fourth encapsulation layer 204 may be made of a silicon carbonitride material. The silicon carbonitride (SiCN) layer mainly plays a role of planarization. The silicon carbonitride has the inorganic property, and thus has a good blocking property. In addition, the silicon carbonitride layer may be well bonded to the glass cover plate 3 located thereon.

It will be noted that, in some embodiments, S112 may be omitted. That is, the encapsulation layer 200 may not include the first encapsulation layer 201.

In some embodiments, the third encapsulation layer 203 may also be made of the silicon carbonitride (SiCN) material. In this case, the third encapsulation layer 203 made of the silicon carbonitride (SiCN) material may cover particles, so as to play a role of planarization.

In some embodiments, in the case where the plurality of light-emitting devices 400 includes the light-emitting devices 400 for emitting red light, the light-emitting devices 400 for emitting green light, and the light-emitting devices 400 for emitting blue light, there is no need to provide the color filter layer 121 in the display panel 1, and thus S115 may be omitted.

The foregoing descriptions are merely specific implementations of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
   a display substrate; and
   an encapsulation layer, wherein
   the display substrate includes:
      a base substrate; and
      a plurality of light-emitting devices disposed on the base substrate, the plurality of light-emitting devices being configured to emit light; and
   the encapsulation layer is located on a side of the light-emitting devices away from the base substrate, and is configured to encapsulate the light-emitting devices;
   the encapsulation layer includes:
      a second encapsulation layer located on the side of the light-emitting devices away from the base substrate, and made of a silicon nitride material; and
      a third encapsulation layer located on a side of the second encapsulation layer away from the light-emitting devices, and made of a silicon carbide material, wherein
   the display panel further comprises a color filter layer located on a side of the third encapsulation layer away from the base substrate, and a fourth encapsulation layer located on a side of the color filter layer away from the third encapsulation layer, the fourth encapsulation layer being made of the silicon carbide material, wherein the second encapsulation layer is in direct contact with the third encapsulation layer, the third encapsulation layer is in direct contact with the color filter layer, and fourth encapsulation layer is in direct contact with the color filter layer.

2. The display panel according to claim 1, wherein the encapsulation layer further includes:
a first encapsulation layer located between the second encapsulation layer and the light-emitting devices, and made of a silicon oxynitride material.

3. The display panel according to claim 2, wherein the first encapsulation layer is a first encapsulation layer manufactured by a chemical vapor deposition process;
the second encapsulation layer is a second encapsulation layer manufactured by another chemical vapor deposition process; and
the third encapsulation layer is a third encapsulation layer manufactured by yet another chemical vapor deposition process.

4. The display panel according to claim 1, wherein the base substrate is a silicon-based backplane integrated with a plurality of pixel circuits;
each of the light-emitting devices includes a first electrode, a light-emitting functional layer and a second electrode; and
the plurality of pixel circuits are electrically connected to respective first electrodes of the light-emitting devices.

5. The display panel according to claim 1, wherein the encapsulation layer further includes a first encapsulation layer located between the second encapsulation layer and the light-emitting devices, and made of a silicon oxynitride material;
the base substrate is a silicon-based backplane integrated with a plurality of pixel circuits;
each of the light-emitting devices includes a first electrode, a light-emitting functional layer and a second electrode; and
the plurality of pixel circuits are electrically connected to respective first electrodes of the light-emitting devices.

6. The display panel according to claim 5, wherein a thickness of the first encapsulation layer is in a range of 1000 Å to 10000 Å, inclusive;
a thickness of the second encapsulation layer is in a range of 1000 Å to 10000 Å, inclusive;
a thickness of the third encapsulation layer is in a range of 2000 Å to 20000 Å, inclusive; and
a thickness of the fourth encapsulation layer is in a range of 1000 Å to 10000 Å, inclusive.

7. A display apparatus, comprising the display panel according to claim 1, and a glass cover plate configured to protect the display panel.

8. A method for manufacturing a display panel, comprising:
forming a display substrate;
forming, on the display substrate, a second encapsulation layer by a chemical vapor deposition process; and
forming, on the second encapsulation layer, a third encapsulation layer by another chemical vapor deposition process, wherein
after forming, on the second encapsulation layer, the third encapsulation layer by the another chemical vapor deposition process the method further comprises: forming a color filter layer on the third encapsulation layer; and forming, on the color filter layer, a fourth encapsulation layer by yet another chemical vapor deposition process;
the third encapsulation layer is made of a silicon carbide material, and the fourth encapsulation layer is made of the silicon carbide material; and
the second encapsulation layer is in direct contact with the third encapsulation layer, the third encapsulation layer is in direct contact with the color filter layer, and fourth encapsulation layer is in direct contact with the color filter layer.

9. The method for manufacturing the display panel according to claim 8, wherein before forming, on the display substrate, the second encapsulation layer by the chemical vapor deposition process, the method further comprises: forming, on the display substrate, a first encapsulation layer by yet another chemical vapor deposition process.

10. The method for manufacturing the display panel according to claim 8, wherein forming the display substrate includes: forming a silicon-based backplane integrated with a plurality of pixel circuits.

11. The method for manufacturing the display panel according to claim 9,
wherein the first encapsulation layer is made of a silicon oxynitride material; and
the second encapsulation layer is made of a silicon nitride material.

* * * * *